(12) United States Patent
Kim et al.

(10) Patent No.: US 9,257,502 B2
(45) Date of Patent: Feb. 9, 2016

(54) LEVEL SHIFT POWER SEMICONDUCTOR DEVICE

(71) Applicant: Fairchild Korea Semiconductor Ltd., Bucheon-si (KR)

(72) Inventors: Min-suk Kim, Bucheon-si (KR); Sun-hak Lee, Anyang-si (KR); Jin-woo Moon, Seoul (KR); Hye-mi Kim, Bucheon-si (KR)

(73) Assignee: Fairchild Korea Semiconductor Ltd., Bucheon-Si (KR)

( * ) Notice: Subject to any disclaimer, the term of this patent is extended or adjusted under 35 U.S.C. 154(b) by 281 days.

(21) Appl. No.: 13/928,186

(22) Filed: Jun. 26, 2013

(65) Prior Publication Data

US 2013/0341718 A1   Dec. 26, 2013

(30) Foreign Application Priority Data

Jun. 26, 2012  (KR) .......................... 10-2012-0068700

(51) Int. Cl.
| | |
|---|---|
| *H01L 29/78* | (2006.01) |
| *H01L 29/772* | (2006.01) |
| *H01L 29/06* | (2006.01) |
| *H01L 29/40* | (2006.01) |
| *H01L 29/66* | (2006.01) |
| *H01L 29/739* | (2006.01) |

(52) U.S. Cl.
CPC ............ *H01L 29/063* (2013.01); *H01L 29/402* (2013.01); *H01L 29/66325* (2013.01); *H01L 29/7393* (2013.01)

(58) Field of Classification Search
CPC ..... H01L 29/7816; H01L 29/78; H01L 29/76; H01L 29/7835; H01L 29/7801; H01L 29/063
USPC .......................................................... 257/401
See application file for complete search history.

(56) References Cited

U.S. PATENT DOCUMENTS

| | | | | |
|---|---|---|---|---|
| 5,023,678 | A | * | 6/1991 | Kinzer .......................... 257/339 |
| 5,801,418 | A | | 9/1998 | Ranjan |
| 7,538,407 | B2 | * | 5/2009 | Taki et al. ...................... 257/492 |
| 8,841,744 | B2 | * | 9/2014 | Imai et al. ...................... 257/495 |
| 2004/0232522 | A1 | * | 11/2004 | Shimizu ......................... 257/548 |
| 2005/0253218 | A1 | * | 11/2005 | Jeon et al. ...................... 257/500 |
| 2010/0271079 | A1 | * | 10/2010 | Choi et al. ..................... 327/108 |

FOREIGN PATENT DOCUMENTS

JP            09-055498      *   2/1995

* cited by examiner

*Primary Examiner* — Jerome Jackson, Jr.
*Assistant Examiner* — Paul Budd
(74) *Attorney, Agent, or Firm* — Brake Hughes Bellermann LLP

(57) ABSTRACT

In one general aspect, a power semiconductor device can include a semiconductor substrate of a first conductivity type, and a semiconductor layer of a second conductivity type disposed on the semiconductor substrate. The semiconductor layer can include a high voltage unit, a low voltage unit disposed around the high voltage unit, and a level shift unit disposed between the high voltage unit and the low voltage unit. The power semiconductor device can include a first isolation region of the first conductivity type disposed between the high voltage unit and the level shift unit, and a second isolation region of the first conductivity type disposed between the low voltage unit and the level shift unit where the first isolation region and the second isolation region each are vertically aligned in the semiconductor layer and each extends to at least the semiconductor substrate.

20 Claims, 12 Drawing Sheets

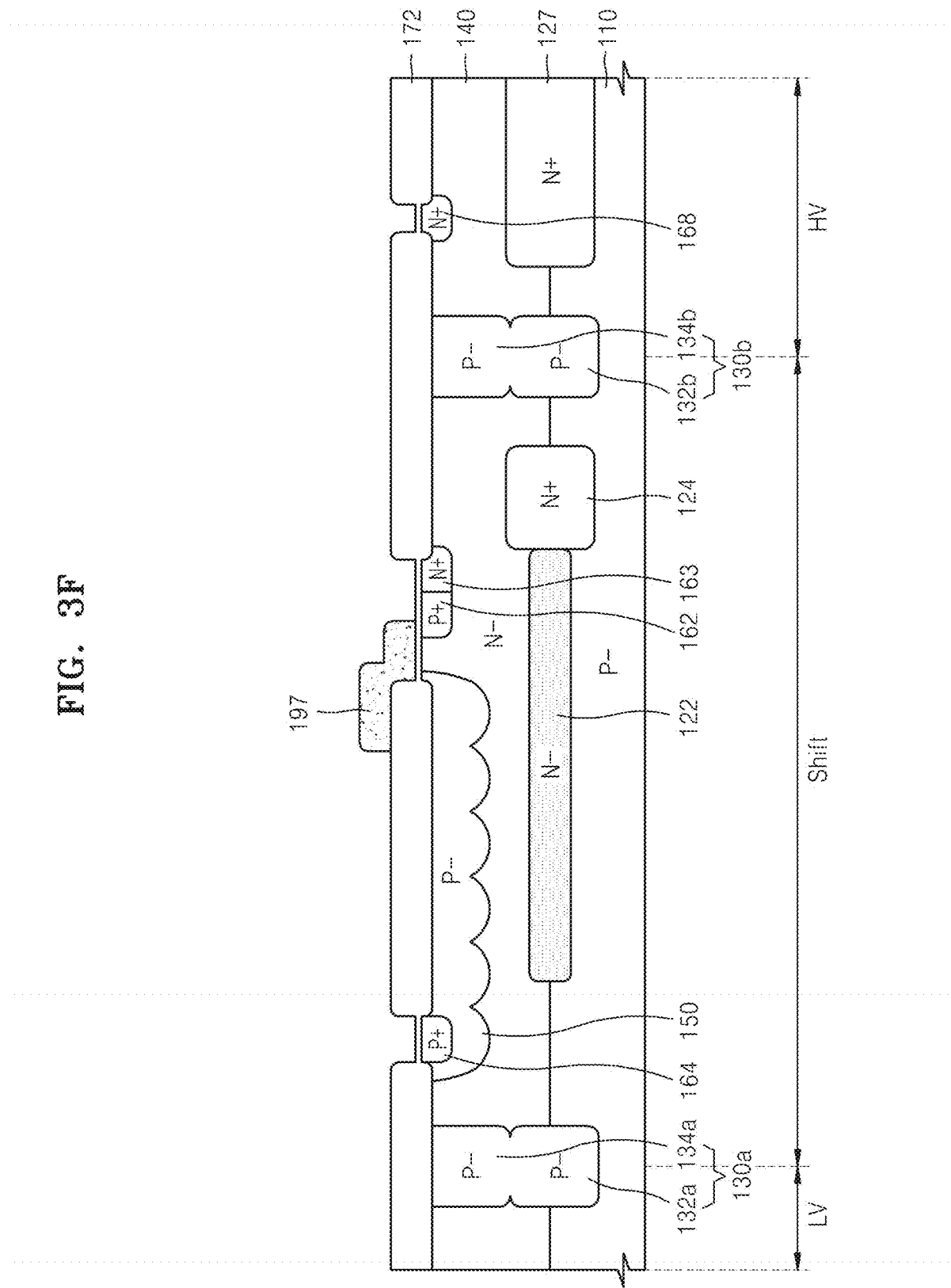

LEVEL SHIFT POWER SEMICONDUCTOR DEVICE

CROSS-REFERENCE TO RELATED APPLICATION

This application claims priority to and the benefit of Korean Patent Application No. 10-2012-0068700, filed on Jun. 26, 2012, in the Korean Intellectual Property Office, the disclosure of which is incorporated by reference herein in its entirety.

BACKGROUND

High voltage integrated circuits (HVICs) in which one or more high voltage transistors are disposed with low voltage circuits on a single chip are being widely applied to power control systems such as switching power supplies and motor drivers. A high voltage integrated circuit (HVIC) includes a high voltage unit, a low voltage unit, and a junction termination disposed between the high voltage unit and the low voltage unit. The junction termination is a region that electrically separates the high voltage unit from the low voltage unit. Level shift devices that level down-shift a signal received from the high voltage unit and provide the signal to the low voltage unit are disposed in the junction termination.

Level shift devices include lateral diffusion MOS (LDMOS) transistors. LDMOS transistors are required to maintain a high breakdown voltage and minimize an on-resistance. By using a reduced surface field (RESURF) technique, a high breakdown voltage may be obtained while an LDMOS transistor has a low on-resistance.

SUMMARY

In one general aspect, a power semiconductor device can include a semiconductor substrate of a first conductivity type, and a semiconductor layer of a second conductivity type disposed on the semiconductor substrate. The semiconductor layer can include a high voltage unit, a low voltage unit disposed around the high voltage unit, and a level shift unit disposed between the high voltage unit and the low voltage unit. The power semiconductor device can include a first isolation region of the first conductivity type disposed between the high voltage unit and the level shift unit, and a second isolation region of the first conductivity type disposed between the low voltage unit and the level shift unit where the first isolation region and the second isolation region each are vertically aligned in the semiconductor layer and each extends to at least the semiconductor substrate.

The concepts described herein can relate to a power semiconductor device, and more particularly, to a high voltage power semiconductor device in which lateral diffusion metal oxide semiconductor (LDMOS) transistors for a level shift are electrically isolated from a high voltage unit. The concepts provide a power semiconductor device including level shift devices with enhanced reliability in which, for example, generation of cross talk can be prevented.

BRIEF DESCRIPTION OF THE DRAWINGS

Exemplary embodiments will be more clearly understood from the following detailed description taken in conjunction with the accompanying drawings in which:

FIGS. 3A to 3G are cross-sectional views for describing a method of manufacturing the power semiconductor device of FIG. 2;

DETAILED DESCRIPTION OF THE EMBODIMENTS

Figure 1A:
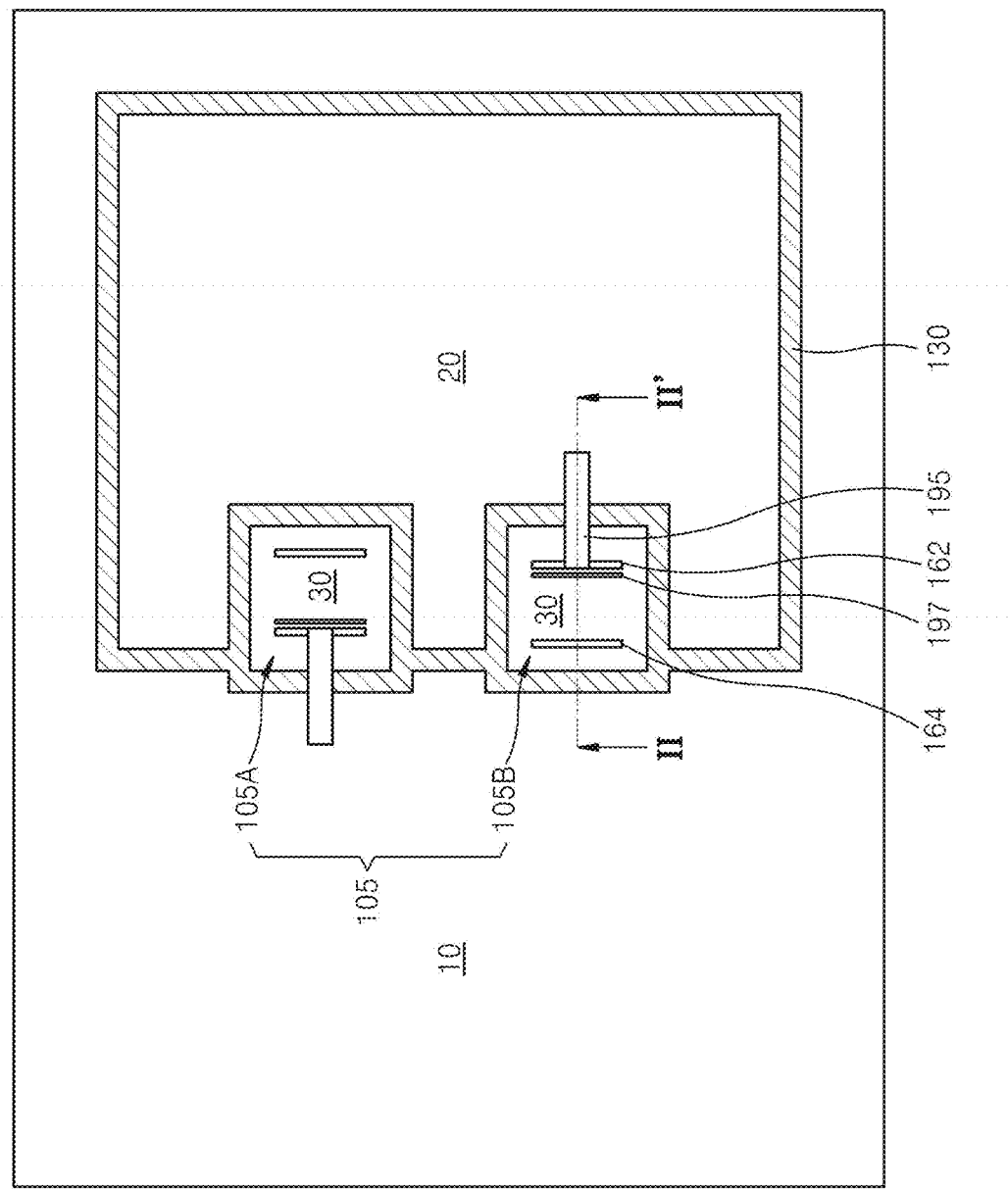
FIGS. 1A and 1B are plan views of power semiconductor devices according to embodiments, respectively.

Hereinafter, the exemplary embodiments will be described in detail with reference to the attached drawings. The concepts may, however, be embodied in many different forms and should not be construed as being limited to the embodiments set forth herein; rather, these embodiments are provided so that this disclosure will be thorough and complete, and will fully convey the concepts to, for example, one of ordinary skill in the art.

It will be understood that when an element or layer is referred to as being "on" another element or layer, the element or layer may be directly on another element or layer or intervening elements or layers. In the accompanying drawings, thicknesses and sizes of layers and regions are exaggerated for clarity, and like numbers refer to like elements throughout the specification. As used herein, the term "and/or" includes any one of at least one of combinations of one or more of the associated listed items. Expressions such as "at least one of," when preceding a list of elements, modify the entire list of elements and do not modify the individual elements of the list.

In the present description, terms, such as first, second, and the like, are used to describe various members, components, regions, layers, and/or portions. However, the elements, components, areas, layers, and/or parts are not limited by these terms. The terms are used only for distinguishing one member, component, region, layer, or portion from another member, component, region, layer, or portion. Thus, a first element, component, region, layer or section discussed below could be termed a second element, component, region, layer or section without departing from the teachings herein.

Hereinafter, the concepts will be described more fully with reference to the accompanying drawings, in which exemplary embodiments are shown. In the drawings, the illustrated features may be changed due to, for example, the manufacturing technology and/or tolerance. Accordingly, it should be understood that the example embodiments are not limited to the drawings but include modifications of the features of elements caused due to, for example, the manufacture.

Figure 1B:
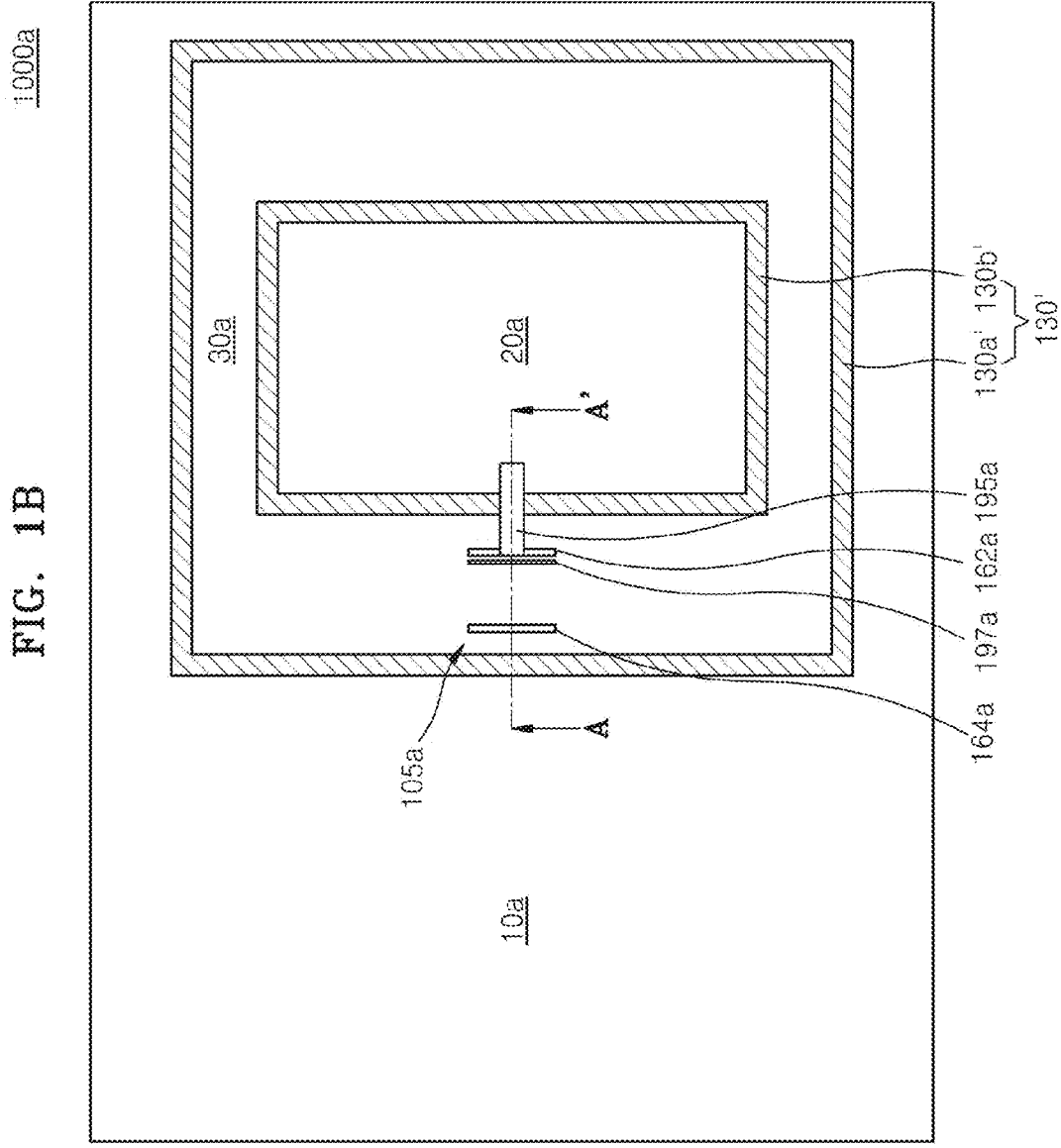

FIGS. 1A and 1B are plan views of power semiconductor devices according to respective embodiments.

Referring to FIG. 1A, a power semiconductor device 1000 includes a low voltage unit 10, a high voltage unit 20, and level shift units 30. The low voltage unit 10 may be disposed around the high voltage unit 20 to surround the high voltage unit 20. The level shift units 30 may be disposed between the low voltage unit 10 and the high voltage unit 20. An isolation region 130 (or a portion thereof) surrounds the high voltage unit 20 and is disposed between the high voltage unit 20 and the low voltage unit 10. In addition, the isolation region 130 (or a portion thereof) also surrounds the level shift units 30. Thus, the low voltage unit 10, the high voltage unit 20, and the level shift units 30 are separated from each other by the isolation region 130 (or portions thereof). Specifically, a first portion of the isolation region 130 surrounds each of the level shift units 30, and a second portion of the isolation region 130 surrounds at least a portion of the high voltage unit 20. Accordingly, the first portion of the isolation region is surrounded, at least in part, by the second portion of the isolation region. Said differently, the first portion of the isolation region, or at least a portion thereof, is disposed within at least a portion of the second portion of the isolation region.

In some implementations, the first portion of the isolation region 130 can be referred to as a first isolation region and the second portion of the isolation region 130 can be referred to as a second isolation region. Accordingly, the first isolation region (or a portion thereof) is surrounded by the second isolation region (or a portion thereof). Said differently, the first isolation region (or a portion thereof) is disposed within the second isolation region (or a portion thereof).

The low voltage unit 10 may provide a low voltage control signal to output a low voltage. The high voltage unit 20 may have an island shape and may provide a high voltage control signal to output a high voltage.

The level shift unit 30 may include a level shift device 105 which level-down-shifts a signal received from the high voltage unit 20 and transfers the level-down-shifted signal to the low voltage unit 10 and level-up-shifts a signal received from the low voltage unit 10 and transfers the level-up-shifted signal to the high voltage unit 20. The level shift device 105 may include a level up-shift device 105A and a level down-shift device 105B. The level shift device 105 may include, for example, an LDMOS transistor. In other words, the level shift device 105 can be a lateral diffusion transistor in which a channel region is formed in the semiconductor layer between a source region and a drain drift region. More particularly, the level up-shift device 105A may include an NMOS (LDMOS) transistor, and the level down-shift device 105B may include a PMOS (LDMOS) transistor.

The level down-shift device 105B may include a drain region 164, a source region 162, and a gate electrode 197 (also can be referred to as a gate region). The drain region 164 may be disposed within the level shift unit 30 to be separated from (e.g., insulated from) the low voltage unit 10. The source region 162 may be disposed within the level shift unit 30 to be separated from the high voltage unit 20. The gate electrode 197 may be disposed within the level shift unit 30 to be separated from the source region 162 and spaced by a predetermined distance (e.g., a lateral distance) apart from the drain region 164.

The level up-shift device 105A may perform a function that is opposite to a function of the level down-shift device 105B as described above.

According to the current embodiment, the power semiconductor device 1000 includes two level shift units 30, but the concept is not limited thereto. The power semiconductor device 1000 may include three or more level shift units 30. If there are three or more level shift units 30, the level shift units 30 may include the level up-shift device 105A and the level down-shift device 105B in various combinations.

A wiring layer 195 may electrically connect the high voltage unit 20 to the level shift unit 30. For example, the wiring layer 195 may be disposed to connect (e.g., electrically connect or couple) the source region 162 to the high voltage unit 20.

Referring to FIG. 1B, a power semiconductor device 1000a includes a low voltage unit 10a, a high voltage unit 20a, and a level shift unit 30a. The low voltage unit 10a may be disposed around the high voltage unit 20a to surround the high voltage unit 20a. The level shift unit 30a may be disposed between the low voltage unit 10a and the high voltage unit 20a.

An isolation region 130' may include a first isolation region 130a' and a second isolation region 130b'. The first isolation region 130a' surrounds the level shift unit 30a and is disposed between the level shift unit 30a and the low voltage unit 10a. The second isolation region 130b' surrounds the high voltage unit 20a and is disposed between the high voltage unit 20a and the level shift unit 30a. Thus, the low voltage unit 10a, the high voltage unit 20a, and the level shift unit 30a may be separated from each other by the isolation region 130'. Specifically, the low voltage unit 10a may be separated from the level shift unit 30a by the isolation region 130a', and the high voltage unit 20a may be separated from the level shift unit 30a by the isolation region 130b'.

The level shift unit 30a may include a level shift device 105a, and the level shift device 105a may include a drain region 164a, a source region 162a, and a gate electrode 197a. The level shift device 105a may be, for example, a level down-shift device. According to the current embodiment, the power semiconductor device 1000a includes one level shift device 105a, but the concept is not limited thereto. For example, another level shift device 105a may be symmetrically disposed in addition to the level shift unit 30a at a right side of the high voltage unit 20a. In addition, according to another embodiment, the level shift unit 30a may further include a resistance region (not shown) that is connected to at least one portion of the high voltage unit 20a and/or the level shift unit 30a in a region where the level shift device 105a is not disposed.

A wiring layer 195a may electrically connect the high voltage unit 20a to the level shift unit 30a. For example, the wiring layer 195a may be disposed to connect the source region 162a to the high voltage unit 20a.

Figure 2:
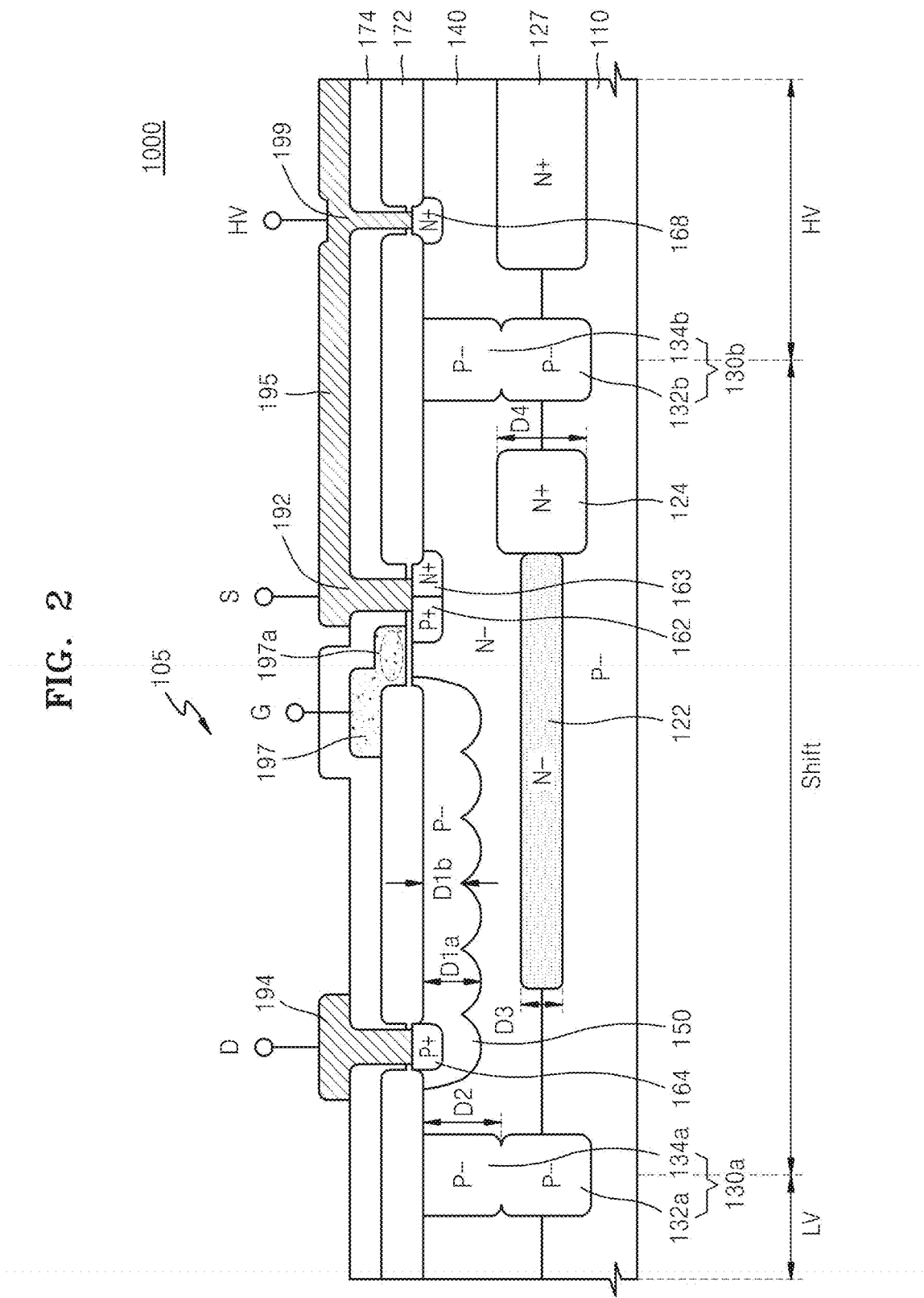
FIG. 2 is a cross-sectional view of a power semiconductor device according to an embodiment, for example, taken along a line II-II' of FIG. 1A.

FIG. 2 is a cross-sectional view of a power semiconductor device according to an embodiment, for example, taken along a line II-II' of FIG. 1A;

Referring to FIG. 2, the power semiconductor device 1000 may include a substrate 110, a semiconductor layer 140, isolation regions 130a and 130b, and a first buried layer 122 (also can also be referred to as a first buried impurity region). In addition, the power semiconductor device 1000 may include a low voltage unit LV, a high voltage unit HV, and a level shift unit Shift. The low voltage unit LV, the high voltage unit HV, and the level shift unit Shift may respectively correspond to the low voltage unit 10, the high voltage unit 20, and the level shift unit 30 of FIG. 1A. The level shift unit Shift may include a level shift device 105, and the level shift device 105 may include a source electrode 192, a drain electrode 194, and a gate electrode 197. In this regard, the level shift device 105 may be the level down-shift device 105B as shown in FIG. 1A.

As shown in FIG. 2, the source region 162 is disposed in the direction of (e.g., laterally in the direction of) the high voltage unit HV and the drain region 164 is disposed in the direction of (e.g., laterally in the direction of) the low voltage unit LV. In other words, the source region 162 and the drain region 162 are disposed between the high voltage unit HV and the low voltage unit LV so that the source region 162 is disposed between the drain region 162 and the high voltage unit HV and the drain region 164 is disposed between the source region 164 and the low voltage unit LV.

The substrate 110 may include a low-concentration first-conductivity-type, for example, P-type semiconductor material, such as Group IV semiconductor, Groups III-V compound semiconductor, or Groups II-VI oxide semiconductor.

For example, Group IV semiconductor may include silicon, germanium, or silicon-germanium. The substrate 110 may be provided as a bulk wafer or epitaxial layer.

A low-concentration second-conductivity-type, for example, N-type, semiconductor layer 140 may be disposed on the substrate 110. The semiconductor layer 140 may be an epitaxial layer.

Isolation regions 130a and 130b may be disposed at boundaries of the low voltage unit LV, the high voltage unit HV, and the level shift unit Shift. The isolation regions 130a and 130b include a first isolation region 130a and a second isolation region 130b which may respectively include lower regions 132a and 132b (also can be referred to as lower well regions) and upper well regions 134a and 134b (also can be referred to as well regions). Each of the isolation regions 130a and 130b can be vertically aligned within at least the semiconductor layer 140. The first isolation region 130a may electrically separate the low voltage unit LV from the level shift unit Shift, and the second isolation region 130b may electrically separate the high voltage unit HV from the level shift unit Shift. The isolation regions 130a and 130b may be regions including low-concentration first-conductivity-type, for example, P-type impurities (or dopants). The lower regions 132a and 132b may (e.g., may each) extend upward (e.g., vertically upward) and downward (e.g., vertically downward) from the boundaries (or interfaces) between the substrate 110 and the semiconductor layer 140.

The upward or downward direction (in accordance with the orientation of FIG. 2) can be referred to as a perpendicular direction or as a vertical direction, and a direction orthogonal to the perpendicular direction (or vertical direction) can be referred to as a horizontal direction or as a lateral direction. The substrate 110 can be aligned along the horizontal direction or the lateral direction, and the semiconductor layer 140 can be stacked on the substrate 110 along the vertical direction or perpendicular direction.

One or more of the lower regions 132a and 132b may each be disposed within or at the boundaries between the substrate 110 and the semiconductor layer 140. For example, lower well region 132a can have a portion at the boundary between the semiconductor layer 140 and the substrate 110 and an upper surface (or portion) within the semiconductor layer 140. The upper well regions 134a and 134b may extend (e.g., extend vertically) from the upper surfaces of the lower regions 132a and 132b to the surface (e.g., a top surface) of the semiconductor layer 140, respectively. In some embodiments, the upper well regions 134a and 134b may extend from the upper surfaces of the lower regions 132a and 132b to an interface between the semiconductor layer 140 and an insulating layer (e.g., first insulating layer 172).

The level shift unit Shift may include at least one level shift device 105. The source electrode 192, the drain electrode 194, and the gate electrode 197 of the level shift device 105 may be disposed on (or above) the semiconductor layer 140. The source electrode 192 and the drain electrode 194 may respectively pass through a first insulating layer 172 and a second insulating layer 174 to be connected to a source region 162 and a drain region 164 of the semiconductor layer 140. The source region 162 and the drain region 164 may be regions including high-concentration first-conductivity-type impurities (e.g., impurities of a first conductivity type). The gate electrode 197 may be disposed to be adjacent to the source electrode 192 between the first insulating layer 172 and the second insulating layer 174. The first insulating layer 172 disposed between the AG 197 and the semiconductor layer 140 may function as a gate insulating layer.

The source electrode 192 may be electrically connected to a first contact region 163 of the semiconductor layer 140, and accordingly, the source electrode 192 may be electrically connected to the semiconductor layer 140. The first contact region 163 may be a region including high-concentration second-conductivity-type impurities (e.g., impurities of a second conductivity type). In addition, the source electrode 192 may be electrically connected to the high voltage electrode 199 by the wiring layer 195. In FIG. 2, the source electrode 192, the wiring layer 195, and the high voltage electrode 199 are integrated, but the concept is not limited thereto. A second contact region 168 may be disposed in the semiconductor layer 140 under the high voltage electrode 199.

A drain drift region 150 surrounds the drain region 164 and extends from the drain region 164 downward to a part of a lower portion 197a of the gate electrode 197. As shown in FIG. 2, the drain drift region 150 extends laterally to a region below (e.g., vertically below) the lower portion of the gate electrode 197 and is insulated from the gate electrode 197 by at least a portion of a dielectric. The drain drift region 150 may be a low-concentration first-conductivity-type, for example, P-type impurity region. The drain drift region 150 may function as a field forming layer to reduce an electric field of the surface of the semiconductor layer 140 and may constitute (or define) a reduced surface field (RESURF) structure. Since the drain drift region 150 is formed with a large depth and has a relatively high concentration among low concentrations, the concentration of the total drain region including the drain region 164 and the drain drift region 150 may be increased. The concentration of the impurities in the drain drift region 150 may be, for example, about $1\times10^{12}/cm^3$ to about $1\times10^{13}/cm^3$. Such a concentration of the total drain drift region reduces generation of voltage difference to prevent variation of current characteristics caused by a parasitic PNP operation.

The lower surface of the drain drift region 150 may have an uneven (e.g., bumpy, wavy) shape having a first longest depth D1a (which can be referred to as a longest depth) and a first shortest depth D1b (which can be referred to as a shortest depth) which are periodically repeated. The first longest depth D1a (which can be referred to as a longest depth) and the first shortest depth D1b (which can be referred to as a shortest depth) can be defined within a medial portion of the drain drift region 150. A method of forming this structure and benefits of the structure will be described later with reference to FIG. 3C. The first longest depth D1a may be the same as or less than the second depth D2 of the upper well region 134a (from a top surface of the semiconductor layer 140 to an upper surface of the lower region 132a).

A first buried layer 122, a second buried layer 124 (also can also be referred to as a second buried impurity region), and a third buried layer 127 (also can also be referred to as a third buried impurity region) may be disposed in an interface (or boundary) between the substrate 110 and the semiconductor layer 140 to extend upward and downward from the interface. The first buried layer 122 may not be formed under (e.g., vertically under or below) the drain electrode 194 and extends from a region adjacent to or apart from a lower portion of the drain electrode 194 to a region adjacent to or apart from a lower portion of the source electrode 192 and the gate electrode 197. The first buried layer 122 has a first portion spaced apart (e.g., isolated from, laterally spaced apart) from the isolation region 164 (by a portion of the semiconductor layer 140 and a portion of the substrate 110) and has a second portion spaced apart (e.g., isolated from, vertically spaced apart) from the second isolation layer 162 (by at least a portion of the semiconductor 140) In other words, the first buried layer 122 may be excluded from a region below (e.g., vertically under or below) the drain electrode 194, and may be separated from the source electrode 192 and/or the gate electrode 197 by a portion of the semiconductor layer 140. The second buried layer 124 may be formed at a region adjacent to or apart from a lower portion of the source electrode 192. The second buried layer 124 may be separated from the source electrode 192 by a portion of the semiconductor layer 140. The third buried layer 127 may be formed in the high voltage unit HV. As shown in FIG. 2, the first buried layer 122 can be in contact with (or adjacent) the second buried layer 124.

Both of the first buried layer 122 and the second buried layer 124 efficiently disperse an electric field generated by the level shift device 105 from the surface of the semiconductor layer 140 toward the substrate 110, to thus play a role of securing (or maintaining) a breakdown voltage. Particularly, the first buried layer 122 may prevent reduction in the breakdown voltage due to the high-concentration drain drift region 150.

The first buried layer 122, the second buried layer 124, and the third buried layer 127 may include second-conductivity-type impurities, respectively. However, the concentration of impurities of the first buried layer 122 may be lower than that of the second buried layer 124. For example, the second buried layer 124 may include impurities having a concentration about $10^2$ times to about $10^3$ times as high as that of the first buried layer 122. The concentration of the impurities of the first buried layer 122 may be greater than that of the semiconductor layer 140. In addition, the first buried layer 122 has a third thickness D3, in which the second buried layer 124 may have a fourth thickness D4 greater than the third thickness D3.

The cross-sectional structure of the power semiconductor device 1000 shown in FIG. 2 may be also applied not only to the power semiconductor device 1000 of FIG. 1A but also the power semiconductor device 1000a of FIG. 1B. The cross-sectional structure of the power semiconductor device 1000 may correspond to, for example, the structure of the power semiconductor device 1000a taken along line A-A' of FIG. 1B.

FIGS. 3A to 3G are cross-sectional views for describing a method of manufacturing the power semiconductor device of FIG. 2.

Figure 3A:
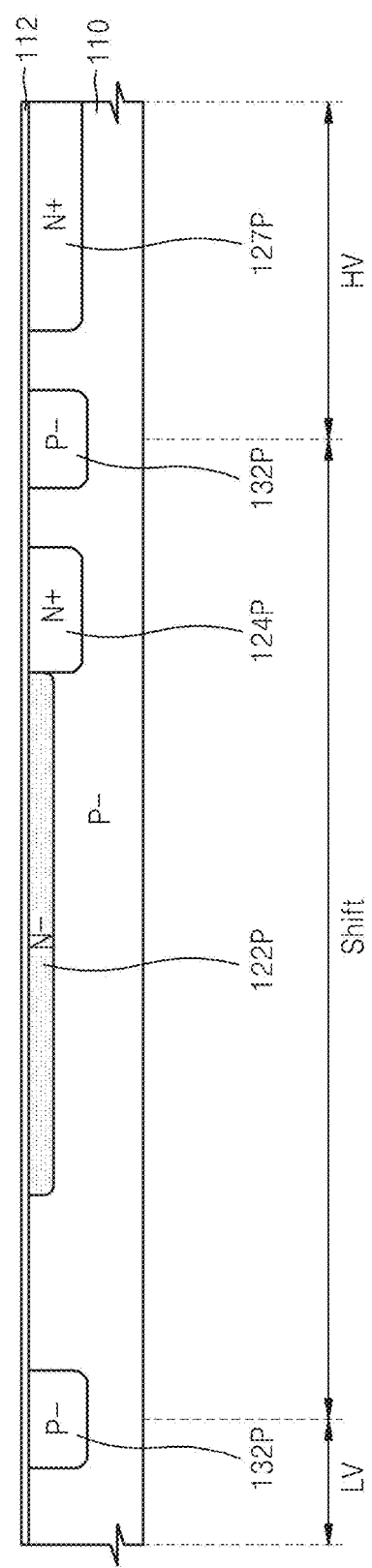

Referring to FIG. 3A, a process of forming a first pad layer 112 on a low-concentration first-conductivity-type, for example, P-type semiconductor substrate 110 may be first performed. The first pad layer 112 may be formed by an oxidation process such as a thermal oxidation process.

Then, a first mask layer (not shown) is formed on the first pad layer 112. The first mask layer may be formed to expose the first pad layer 112 corresponding to portions where a first pre-buried layer 122P is formed. Low-concentration second-conductivity-type, for example, N-type impurities are ion-injected into the substrate 110 by using the first mask layer as an ion injection mask to form the first pre-buried layer 122P in the level shift unit Shift. According to another embodiment, the impurities may be high-concentration second-conductivity-type, for example, N+ type impurities.

Then, the first mask layer is removed, and a second mask layer (not shown) is formed on the first pad layer 112. The second mask layer may be formed to expose the first pad layer 112 corresponding to portions where a second pre-buried layer 124P and a third pre-buried layer 127P are formed. High-concentration second-conductivity-type, for example, N+ type impurities are ion-injected into the substrate 110 by using the second mask layer as an ion injection mask to respectively form the second pre-buried layer 124P and the third pre-buried layer 127P in the level shift unit Shift and the high voltage unit HV. The concentrations of the impurity for forming the second pre-buried layer 124P and the third pre-buried layer 127P may be greater than that of the first pre-buried layer 122P. The second pre-buried layer 124P may contact the first pre-buried layer 122P at one end, but the concept is not limited thereto.

Then, the second mask layer is removed, and a third mask layer (not shown) is formed on the first pad layer 112. The third mask layer may be formed to expose the first pad layer 112 corresponding to portions where pre-lower regions 132P are formed. Low-concentration first-conductivity-type impurities are ion-injected into the substrate 110 by using the third mask layer as an ion injection mask to respectively form the pre-lower regions 132P at a boundary between the level shift unit Shift and the low voltage unit LV and a boundary between the level shift unit Shift and the high voltage unit HV.

Figure 3B:
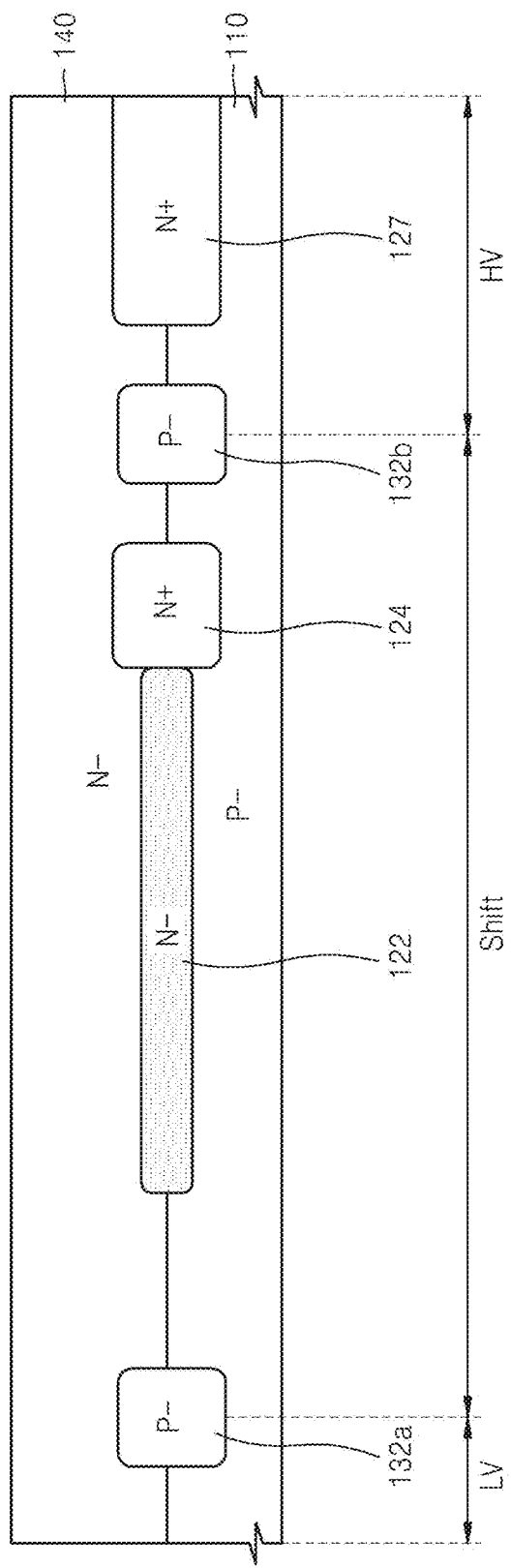

Referring to FIG. 3B, a process of removing the third mask layer and the first pad layer 112 may be first performed.

Then, a low-concentration second-conductivity-type, for example, N-type semiconductor layer 140 is formed on the substrate 110. The semiconductor layer 140 may be formed by using an epitaxial growth process. If a high temperature process is conducted during the growth of the semiconductor layer 140, the impurities of the first pre-buried layer 122P, the second pre-buried layer 124P, the third pre-buried layer 127P, and the pre-lower regions 132P of FIG. 3A are partially diffused into the semiconductor layer 140 to form the first buried layer 122, the second buried layer 124, the third buried layer 127, and the lower regions 132a and 132b. Optionally, a process for diffusing the impurities may further be performed.

Figure 3C:
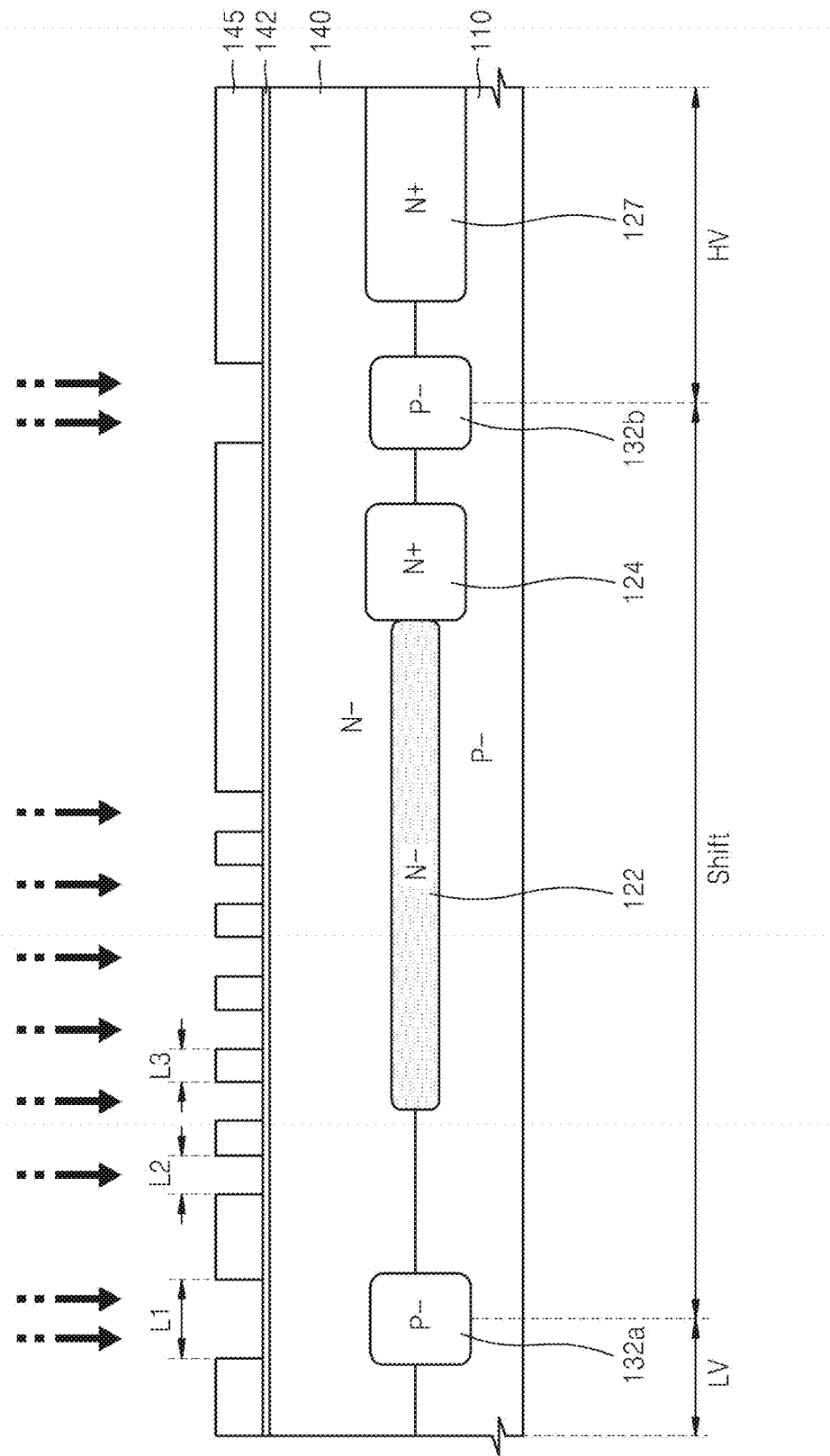

Referring to FIG. 3C, a process of forming a second pad layer 142 on the semiconductor layer 140 may be first performed. The second pad layer 142 may be formed by an oxidation process such as a thermal oxidation process.

Then, a fourth mask layer 145 is formed on the second pad layer 142. The fourth mask layer 145 may be formed to expose the second pad layer 142 corresponding to at least one portion where the upper well regions 134a and 134b (refer to FIG. 3D) and a drain drift region 150 (refer to FIG. 3D) will be formed. Although, in this stage, the fourth mask layer 145 may be formed to expose regions smaller than widths of the upper well regions 134a and 134b and the drain drift region 150 in consideration of diffusion of the injected impurities.

The fourth mask layer 145 may be patterned in a slit shape to form the drain drift region 150. That is, in a region corresponding to the drain drift region 150, the fourth mask layer 145 may be patterned in the form of bars spaced apart from each other by a predetermined distance. The fourth mask layer 145 may form (or define) an opening having a first length L1 at a region corresponding to the upper well regions 134a and 134b and may form (or define) an opening having a second length L2 smaller than the first length L1 at a region corresponding to the drain drift region 150. For example, the second length L2 may be ⅕ to ⅓ of the first length L1. A plurality of openings having the second length L2 may be disposed at an interval (or spacing) of a third length L3. Relative sizes of the second length L2 and the third length L3 may vary in various manners and are not limited to those shown in the drawings. The number of the openings of the drain drift region 150 is not limited and may be increased.

Then, a low-concentration first-conductivity-type, for example P-type impurity may be ion-injected into the semiconductor layer 140 by using the fourth mask layer 145 as an ion injection mask. An arrow of FIG. 3C indicates ion injection.

Figure 3D:
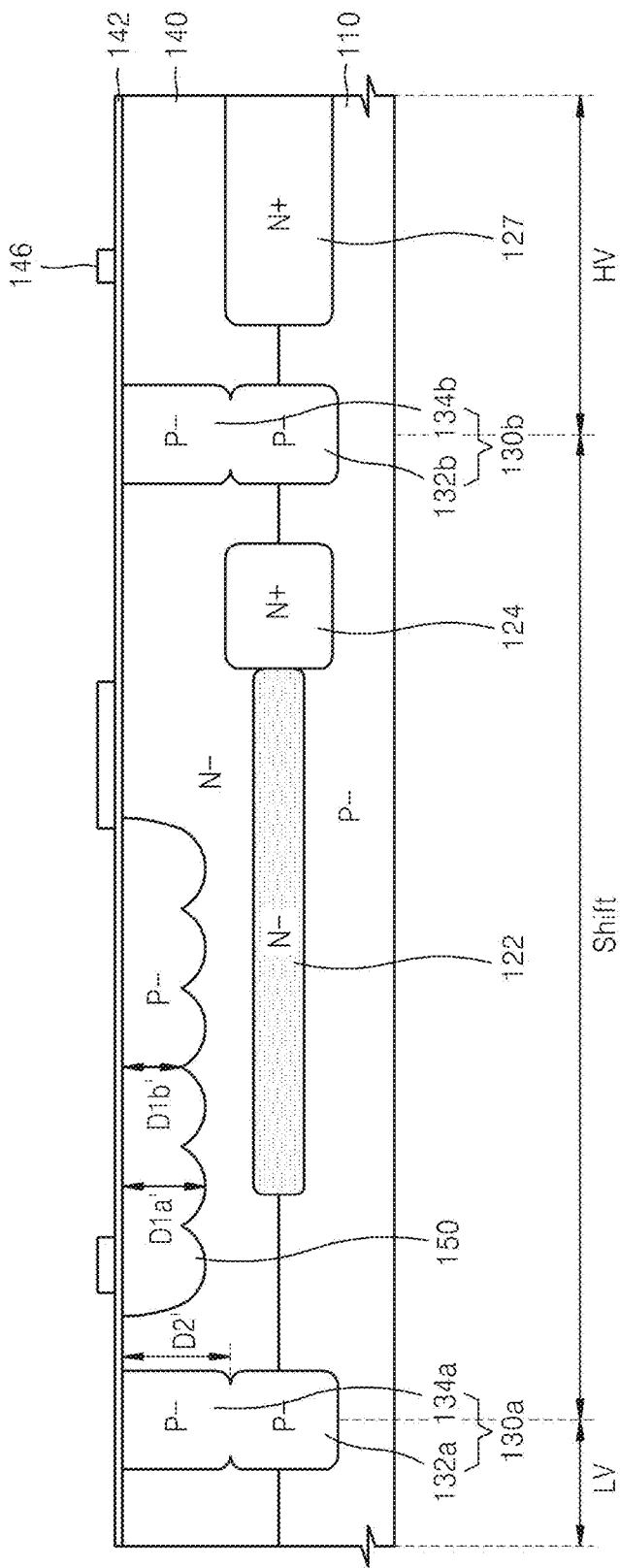

Referring to FIG. 3D, the drain drift region 150 and upper well regions 134a and 134b are formed by the ion injection described above. The drain drift region 150 may have a first longest depth D1a' and a first shortest depth D1b' which are periodically repeated, thereby having a curved lower surface. In some embodiments, the drain drift region 150 defines a series or set of curved lower surfaces.

The first longest depth D1a' corresponds to a region where one of the openings is formed by the fourth mask layer 145, and the first shortest depth D1b' corresponds to a region where one of the bar-shaped portions of the fourth mask layer 145 is disposed. The curved lower surface of the drain drift region 150 may be formed by the impurities which are injected via the opening and diffused. The first longest depth D1a' may be the same as or less than the second depth D2' of the upper well regions 134a and 134b. In case that the size of the opening is small, the content of the impurities and/or the depths of the impurities may vary.

According to the concept, the depth of the drain drift region 150 may be different from those of the upper well regions 134a and 134b by patterning of the slit shape while the drain drift region 150 is formed by using the same process as those of the upper well regions 134a and 134b.

Then, the fourth mask layer 145 is removed, and a nitride pattern layer 146 is formed on the second pad layer 142. The nitride pattern layer 146 exposes the second pad layer 142 corresponding to regions where thick regions of a first insulating layer 172 (refer to FIG. 3E) will be formed in a subsequent process.

Figure 3E:
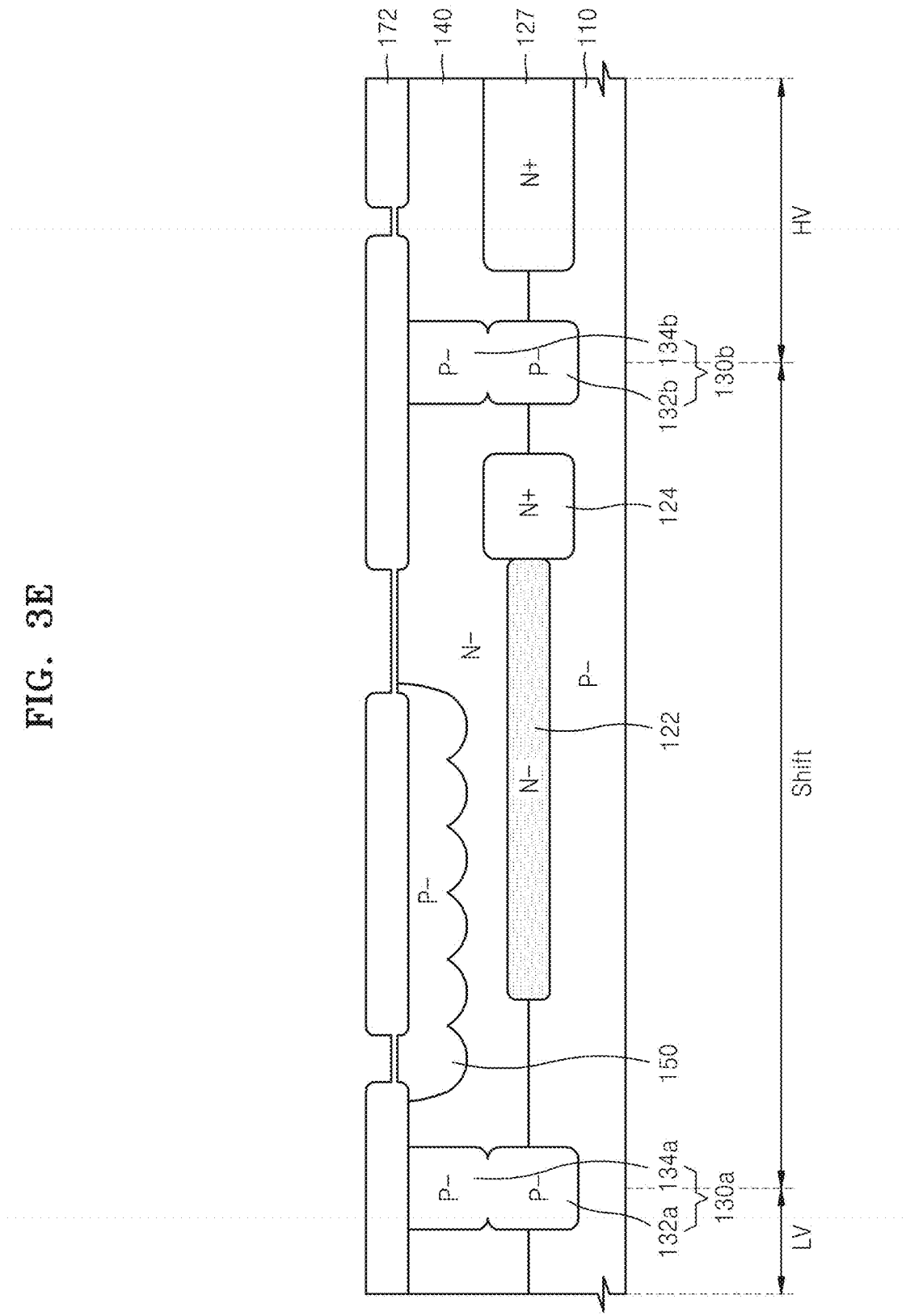

Referring to FIG. 3E, a first insulating layer 172 is formed on the semiconductor layer 140 by using a local oxidation of silicon (LOCOS) process. The first insulating layer 172 refers to a layer including an insulating material layer formed by the LOCOS process, and the second pad layer 142 formed below the nitride pattern layer 146. Particularly, thick portions of the first insulating layer 172 protect a device region including the semiconductor layer 140 and electrically separate the device region from layers that will be formed thereon.

Then, a process of removing the nitride pattern layer 146 may be performed.

Referring to FIG. 3F, a process of depositing a conductive layer on the first insulating layer 172 may be first performed. Then, the conductive layer is patterned to form a gate electrode 197 on the first insulating layer 172 that partially overlaps the drain drift region 150. The gate electrode 197 is formed such that a portion of the gate electrode 197 is formed on the semiconductor layer 140 at a side of the drain drift region 150. The gate electrode 197 may include, for example, polysilicon.

Then, a fifth mask layer (not shown) is formed on the first insulating layer 172. The fifth mask layer may be formed to expose the first insulating layer 172 corresponding to portions where a first contact region 163 and a second contact region 168 are formed. High-concentration second-conductivity-type, for example, N+ type impurities are ion-injected into the semiconductor layer 140 by using the fifth mask layer as an ion injection mask to respectively form the first contact region 163 and the second contact region 168 in the level shift unit Shift and the high voltage unit HV.

Then, the fifth mask layer is removed, and a sixth mask layer (not shown) is formed on the first insulating layer 172. The sixth mask layer may be formed to expose the first insulating layer 172 corresponding to portions where a source region 162 and a drain region 164 are formed. High-concentration first-conductivity-type, for example, P+ type impurities are ion-injected into the semiconductor layer 140 by using the sixth mask layer as an ion injection mask to form the source region 162 and the drain region 164 in the level shift unit Shift. Then, a process of removing the sixth mask layer may be performed.

Figure 3G:
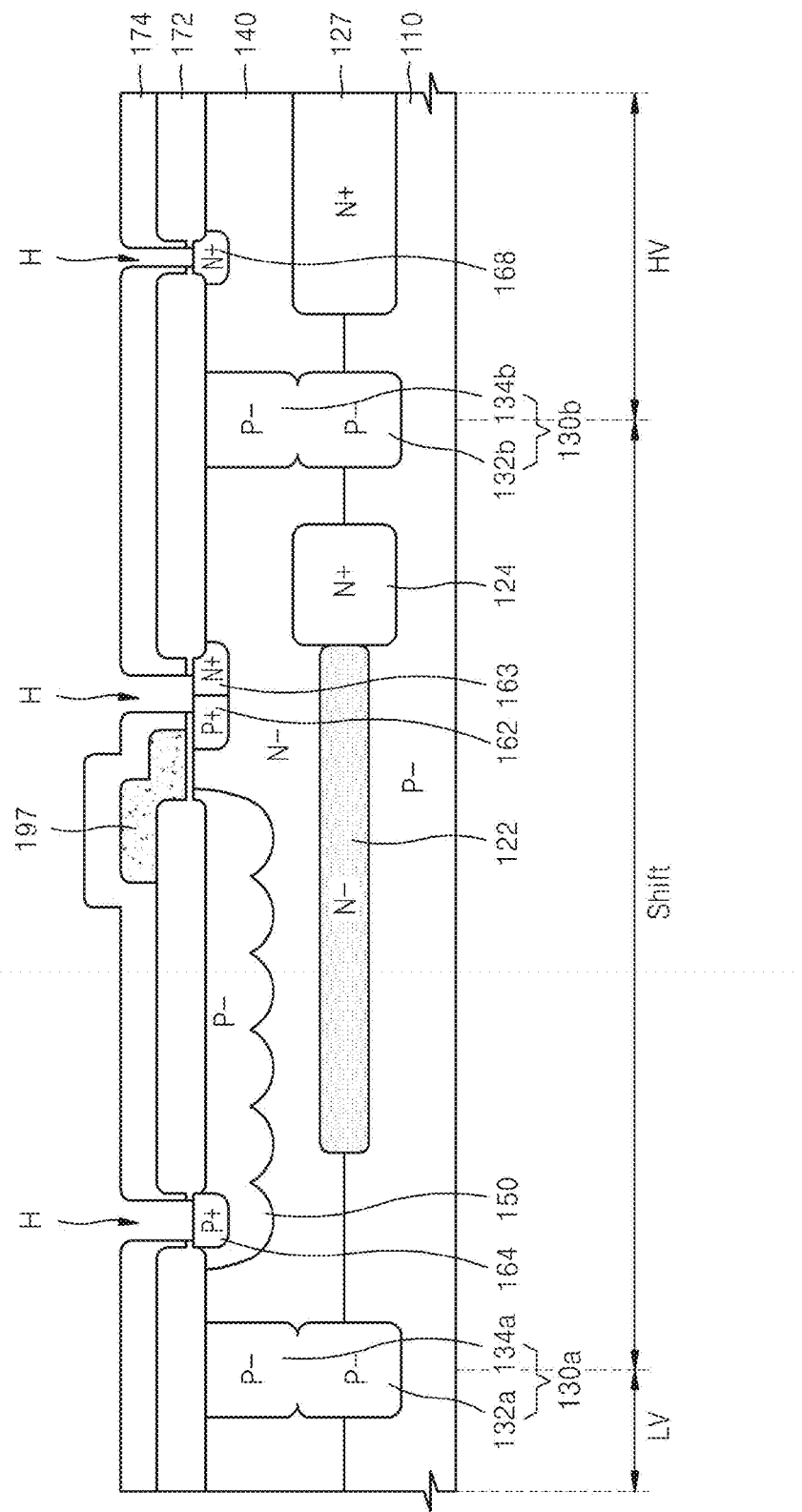

Referring to FIG. 3G, a second insulating layer 174 is first formed on the first insulating layer 172 and the gate electrode 197. Then, contact holes H are formed by partially etching the first insulating layer 172 and the second insulating layer 174. Via the contact holes H, the source region 162, the drain region 164, the first contact region 163, and the second contact region 168 may be exposed.

Then, referring to FIG. 2, a source electrode 192 connected to the source region 162 via the contact hole H and a drain electrode 194 connected to the drain region 164 via the contact hole H may be formed on the second insulating layer 174 by a wiring process. In addition, a wiring layer 195 that extends from the source electrode 192 and is electrically connected to the second contact region 168 of the high voltage unit HV is formed on the second insulating layer 174. A high voltage electrode 199 is formed at the second contact region 168 of the high voltage unit HV. Accordingly, the power semiconductor device 1000 of FIG. 2 is manufactured.

Figure 4:
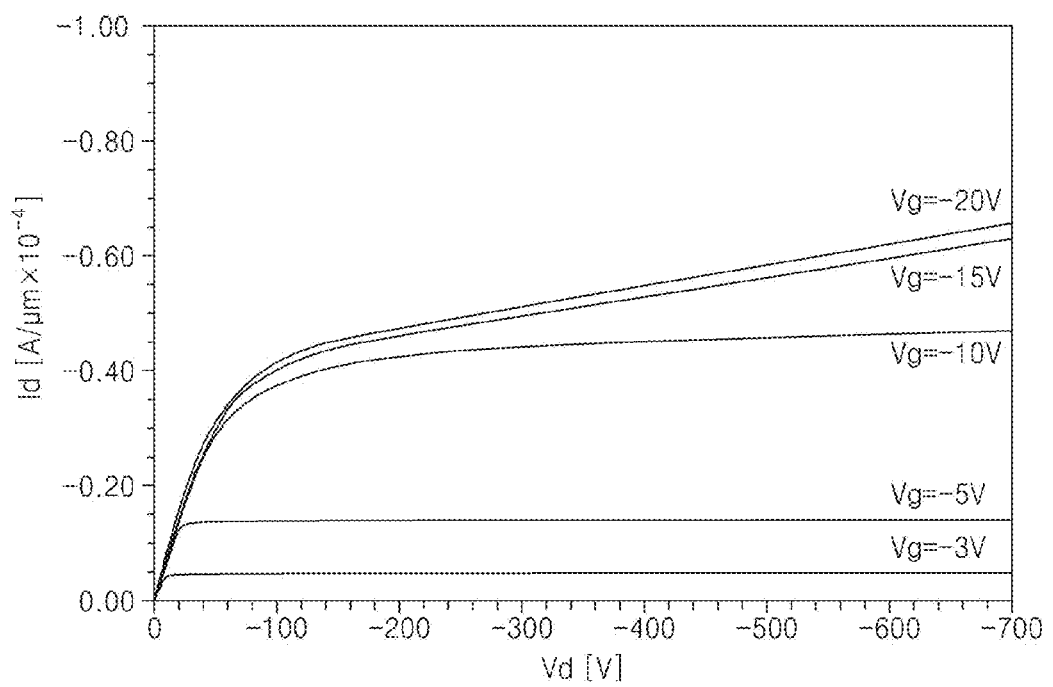
FIG. 4 is a graph illustrating results of a simulation for describing current characteristics of a power semiconductor device according to an embodiment.

FIG. 4 is a graph of results of a simulation for describing current characteristics of a power semiconductor device according to an embodiment.

Referring to FIG. 4, drain current Id with respect to drain voltage Vd and gate voltage Vg is illustrated. FIG. 4 shows electrical characteristics of typical transistors including linear regions and saturated regions according to variation of the gate voltage Vg.

These results may be compared with characteristics of a power semiconductor device according to a comparative embodiment in which the first buried layer 122 and the drain drift region 150 are not used. In the power semiconductor device according to the comparative embodiment, although not shown herein, there is a region where a secondary differential coefficient of current with respect to voltage is positive immediately after a linear region. The existence of the region may be considered as influence by a parasitic PNP.

Accordingly, in the power semiconductor device, influence by parasitic PNP may be prevented by forming the drain drift region 150 having a high concentration and a long depth.

Figure 5:
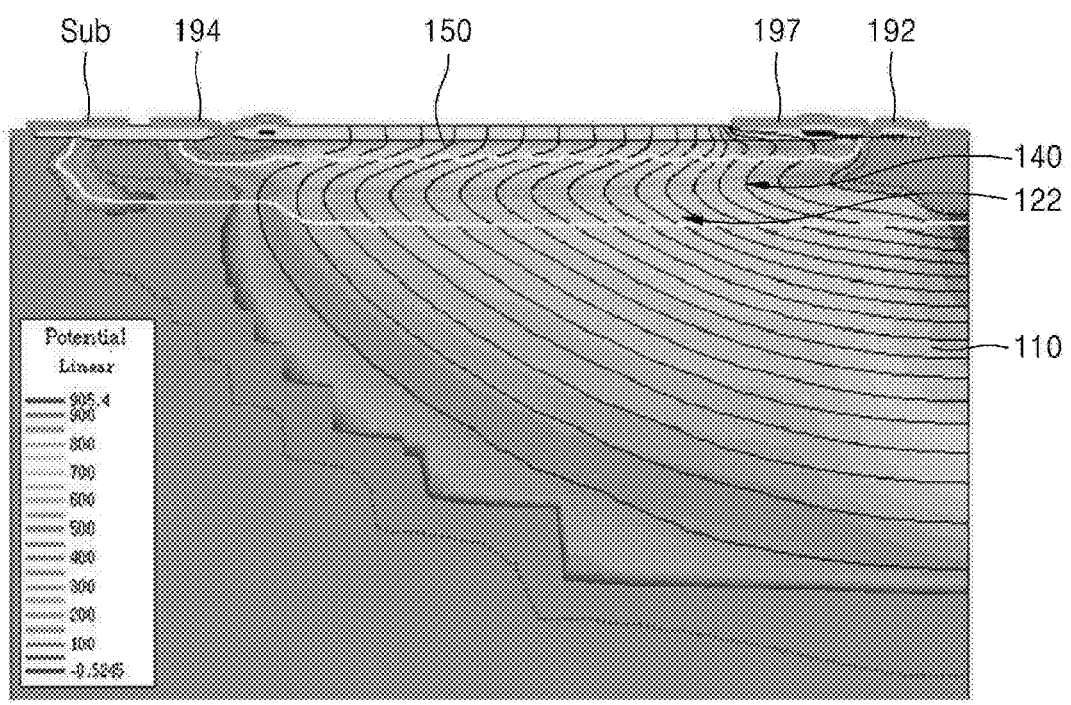
FIG. 5 illustrates results of a simulation for describing breakdown voltage characteristics of a power semiconductor device according to an embodiment.

FIG. 5 represents results of a simulation that illustrate breakdown voltage characteristics of a power semiconductor device according to an embodiment.

Referring to FIG. 5, the simulation is conducted while the drain electrode 194, the gate electrode 197, and the substrate 110 are grounded and a voltage of the source electrode 192 is increased. An electrode connected to the substrate 110 is indicated as 'Sub'. A boundary where the drain drift region 150, the source region 162, and the drain region 164 are bordered by the semiconductor layer 140, and a boundary where the semiconductor layer 140 and the first buried layer 122 are bordered by the substrate 110 are shown as white lines. Equipotential lines and depletion layers are shown as dashed lines.

As shown herein, an electric field is uniformly distributed in the drain drift region 150, and the depletion layer is slanted to the lower portion of the source region 162 after a pinch-off occurs. If a high electric field is concentrated on the surface of the semiconductor layer 140, the power semiconductor device may deteriorate. However, a high electric field is concentrated at a lower portion of the substrate 110. In addition, since the semiconductor layer 140 is completely depleted, a high breakdown voltage may be obtained. The breakdown voltage is about 905 V, which satisfies a target range of the power semiconductor device. In the power semiconductor device in which the first buried layer 122 and the drain drift region 150 are not used, a breakdown voltage was about 727 V. Thus, it can be seen identified that the breakdown voltage is improved.

Thus, in the power semiconductor device, a charge balance may be entirely maintained and a high breakdown voltage may be obtained by simultaneously forming the drain drift region 150 and the first buried layer 122.

As described above, according to one or more of the above embodiments, a parasitic PNP operation may be prevented by increasing the concentration of a drain drift region of a level shift device region in the power semiconductor device. In addition, a high breakdown voltage may be obtained by efficiently dispersing an electric field generated by the level shift device from the surface of the semiconductor layer to the bulk substrate by forming the buried impurity region under the drain drift region.

In addition, according to the power semiconductor device, the level shift device region is electrically isolated from the low voltage unit and the high voltage unit by a P-type isolation region, so that the generation of a cross talk can be prevented between the high voltage unit and the level shift device, and signal interference may be prevented.

According to an aspect, there is provided a power semiconductor device including: a first-conductivity-type semiconductor substrate; a second-conductivity-type semiconductor layer which is disposed on the substrate, and having a high voltage unit, a low voltage unit disposed around the high voltage unit, and a level shift unit disposed between the high voltage unit and the low voltage unit; and first-conductivity-type first isolation region which is disposed between the high voltage unit and the level shift unit; and a first-conductivity-type second isolation region which is disposed between the low voltage unit and the level shift unit, and wherein the first-conductivity-type first isolation region and the first-conductivity-type second isolation region are vertically disposed in the semiconductor layer and extending to the substrate.

The level shift unit may include: a first-conductivity-type source region that is disposed in the direction of the high voltage unit; a first-conductivity-type drain region that is disposed in the direction of the low voltage unit; a gate electrode that is disposed on the semiconductor layer between the source region and the drain region; and a first-conductivity-type drain drift region that surrounds the drain region and extends to a lower portion of the gate electrode.

The level shift unit may include a second-conductivity-type first buried impurity region disposed at the boundary between the substrate and the semiconductor layer.

The first buried impurity region extends from first portion which is spaced apart from the first-conductivity-type first isolation region to second portion which is spaced apart from the first-conductivity-type second isolation region.

The level shift unit further comprises a second-conductivity-type second buried impurity region disposed to be adjacent to the first buried impurity region.

The concentration of the impurity of the first buried impurity region may be less than that of impurities of the second buried impurity region.

The second buried impurity region may have a greater thickness than the first buried impurity region in a direction perpendicular to the substrate.

The power semiconductor device may further include a wiring layer that electrically connects the source region to the high voltage unit.

The first-conductivity-type may be P type, and the second-conductivity-type may be N type.

The concentration of the first buried impurity region may be greater than that of impurities of the semiconductor layer.

A plurality of the level shift units may be disposed to be spaced apart from each other, and the first-conductivity-type first isolation region and the first-conductivity-type second isolation region respectively surround the level shift units.

According to another aspect, there is provided a power semiconductor device including: a first-conductivity-type semiconductor substrate; a second-conductivity-type semiconductor layer which is disposed on the substrate, and has a high voltage unit, a low voltage unit disposed around the high voltage unit, and a level shift unit disposed between the high voltage unit and the low voltage unit; and a first-conductivity-type isolation region that surrounds the high voltage unit and the level shift unit, wherein the level shift unit includes a drain drift region that has a uneven lower surface.

The level shift unit may include a second-conductivity-type first buried impurity region disposed at the boundary between the substrate and the semiconductor layer.

The level shift unit may include: a first-conductivity-type source region that is disposed to be adjacent to the high voltage unit; a first-conductivity-type drain region that is disposed to be adjacent to the low voltage unit; and a gate electrode that is disposed on the semiconductor layer between the source region and the drain region, and wherein the drain drift region is of a first-conductivity-type, surrounds the drain region, and extends to a lower portion of the gate electrode.

The isolation region may include a lower region that extends from an interface between the substrate and the semiconductor layer to the semiconductor layer to a predetermined height; and an upper well region that extends from the upper surface of the lower region to the surface of the semiconductor layer, and the first depth is the same as or less than a distance from the surface of the semiconductor layer to the lower surface of the upper well region.

According to another aspect, there is provided a power semiconductor device including: a high voltage unit that provides a high voltage control signal to output a high voltage; a low voltage unit that provides a low voltage control signal to output a low voltage and is disposed around the high voltage unit; a level shift device that is disposed between the high voltage unit and the low voltage unit and includes a level-down-shift device that level-down-shifts a signal received from the high voltage unit and transfers the signal to the low voltage unit and a level-up-shift device that level-up-shifts a signal received from the low voltage unit and transfers the signal to the high voltage unit; and an isolation region that is disposed to surround the high voltage unit and the level shift device and electrically separates the high voltage unit from the level shift unit.

The level shift device may be disposed on a substrate and a stack structure of a semiconductor layer formed on the substrate, and may include a source region, a drain region, a gate region, and a drain drift region that surrounds the drain region and extends to a lower portion of the gate region.

The level shift device may be a lateral diffusion transistor in which a channel region is formed in the semiconductor layer between the source region and the drain drift region.

The power semiconductor device may further include a first buried impurity region disposed at interface between the substrate and the semiconductor layer under the drain drift region.

The power semiconductor device may further include: a contact region that contacts the source region and makes ohmic contact to the semiconductor layer; and a source electrode that is connected to both of the source region and the contact region.

While the concepts have been particularly shown and described with reference to exemplary embodiments thereof, it will be understood that various changes in form and details may be made therein without departing from the spirit and scope of the following claims.

What is claimed is:

1. A power semiconductor device, comprising:
a semiconductor substrate of a first conductivity type;
a semiconductor layer of a second conductivity type disposed on the semiconductor substrate, the semiconductor layer including:
a high voltage unit,
a low voltage unit disposed around the high voltage unit, and
a level shift unit disposed between the high voltage unit and the low voltage unit;
a first isolation region of the first conductivity type disposed between the high voltage unit and the level shift unit; and
a second isolation region of the first conductivity type disposed between the low voltage unit and the level shift unit,
the first isolation region and the second isolation region each being vertically aligned in the semiconductor layer and each extending to at least the semiconductor substrate,
the level shift unit including:
a source region of the first conductivity type,
a drain region of the first conductivity type disposed between the source region and the low voltage unit,
a gate electrode disposed above the semiconductor layer laterally between the source region and the drain region,
a drain drift region of the first conductivity type surrounding the drain region and extending to a lower portion of the gate electrode, and
a buried impurity region of the second conductivity type disposed at a boundary between the semiconductor substrate and the semiconductor layer.

2. The power semiconductor device of claim 1, wherein the buried impurity region extends from a first portion of the buried impurity region to a second portion of the buried impurity region, the first portion of the buried impurity region is spaced apart from the first isolation region and the second portion of the buried impurity region is spaced apart from the second isolation region.

3. The power semiconductor device of claim 1, wherein the buried impurity region is a first buried impurity region, the level shift unit further includes a second buried impurity region of the second conductivity type disposed adjacent to the first buried impurity region.

4. The power semiconductor device of claim 3, wherein the first buried impurity region has a concentration of impurities that is less than a concentration of impurities of the second buried impurity region.

5. The power semiconductor device of claim 3, wherein the second buried impurity region has a greater thickness than a thickness of the first buried impurity region in a direction perpendicular to the substrate.

6. The power semiconductor device of claim 1, further comprising a wiring layer that electrically connects the source region to the high voltage unit.

7. The power semiconductor device of claim 1, wherein the buried impurity region has a concentration of impurities greater a concentration of impurities of impurities of the semiconductor layer.

8. The power semiconductor device of claim 1, wherein the level shift unit is included in a plurality of the level shift units, each of the plurality of level shift units is spaced apart from other of the plurality of level shift units, and the first isolation region surrounds the plurality of level shift units.

9. The power semiconductor device of claim 1, wherein the level shift unit is a first level shift unit,
the semiconductor layer further includes:
a second level shift unit spaced apart from the first level shift unit, the second isolation region surrounds the first level shift unit and the second level shift unit, at least a portion of the second isolation region is disposed inside of the first isolation region.

10. A power semiconductor device, comprising:
a semiconductor substrate of a first conductivity type;
a semiconductor layer of a second conductivity type disposed on the semiconductor substrate, and including a high voltage unit, a low voltage unit disposed around the high voltage unit, and a level shift unit disposed between the high voltage unit and the low voltage unit; and
an isolation region of the first conductivity type surrounding the high voltage unit and the level shift unit, the level shift unit including a drain drift region having an uneven lower surface
the level shift unit including:
a source region of the first conductivity type disposed adjacent to the high voltage unit,
a drain region of the first conductivity type disposed adjacent to the low voltage unit, and
a gate electrode disposed on the semiconductor layer between the source region and the drain region,
the drain drift region having the first conductivity type, surrounding the drain region, and extending to a lower portion of the gate electrode.

11. The power semiconductor device of claim 10, wherein the level shift unit includes a buried impurity region of the second conductivity type disposed at a boundary between the semiconductor substrate and the semiconductor layer.

12. The power semiconductor device of claim 10, wherein the isolation region includes:
a lower region that has a portion disposed at an interface between the semiconductor substrate and the semiconductor layer and has an upper surface disposed in the semiconductor layer, and
an upper region that extends from the upper surface of the lower region to a top surface of the semiconductor layer,
the drain drift region has a depth that is the same as or less than a distance from the top surface of the semiconductor layer to the upper surface of the lower region.

13. A power semiconductor device, comprising:
a high voltage unit configured to receive a high voltage control signal to output a high voltage;
a low voltage unit configured to receive a low voltage control signal to output a low voltage, the low voltage unit being disposed around the high voltage unit;
a level shift device disposed between the high voltage unit and the low voltage unit, the level shift device including:
a level-down-shift device configured to level-down-shift a signal received from the high voltage unit and configured to transfer the signal to the low voltage unit, and a level-up-shift device that level-up-shifts a signal received from the low voltage unit and transfers the signal to the high voltage unit;

an isolation region surrounding the high voltage unit and the level shift device, and electrically separating the high voltage unit from the level shift device, the level shift device including a source region, a drain region, a gate region, and a drain drift region that surrounds the drain region and extends to a lower portion of the gate region; and a first buried impurity region disposed at an interface between a substrate and a semiconductor layer, the first buried impurity region being disposed under at least a portion of the drain drift region.

14. The power semiconductor device of claim 13, wherein the level shift device is disposed on the substrate and a stack structure of the semiconductor layer formed on the substrate.

15. The power semiconductor device of claim 14, wherein the level shift device is a lateral diffusion transistor in which a channel region is formed in the semiconductor layer between the source region and the drain drift region.

16. The power semiconductor device of claim 14, further comprising:

a contact region contacting the source region and making ohmic contact to the semiconductor layer; and a source electrode connected to both of the source region and the contact region.

17. A power semiconductor device, comprising:

a semiconductor substrate of a first conductivity type;

a semiconductor layer of a second conductivity type disposed on the semiconductor substrate, and including a high voltage unit, a low voltage unit disposed around the high voltage unit, and a level shift unit disposed between the high voltage unit and the low voltage unit; and an isolation region of the first conductivity type surrounding the high voltage unit and the level shift unit, the level shift unit including a drain drift region having an uneven lower surface spaced apart from the semiconductor substrate.

18. The power semiconductor device of claim 17, wherein the level shift unit includes a buried impurity region of the second conductivity type disposed at a boundary between the semiconductor substrate and the semiconductor layer.

19. The power semiconductor device of claim 17, wherein the level shift unit includes:

a source region of the first conductivity type disposed adjacent to the high voltage unit;

a drain region of the first conductivity type disposed adjacent to the low voltage unit; and a gate electrode disposed on the semiconductor layer between the source region and the drain region, the drain drift region is of the first conductivity type, surrounds the drain region, and extends to a lower portion of the gate electrode.

20. The power semiconductor device of claim 19, wherein the isolation region includes:

a lower region that has a portion disposed at an interface between the semiconductor substrate and the semiconductor layer and has an upper surface disposed in the semiconductor layer, and an upper region that extends from the upper surface of the lower region to a top surface of the semiconductor layer, the drain drift region has a depth that is the same as or less than a distance from the top surface of the semiconductor layer to the upper surface of the lower region.

* * * * *